(12) United States Patent
Anderson et al.

(10) Patent No.: US 10,275,222 B2
(45) Date of Patent: *Apr. 30, 2019

(54) TECHNOLOGIES FOR PHYSICAL PROGRAMMING

(71) Applicant: Intel Corporation, Santa Clara, CA (US)

(72) Inventors: Glen J. Anderson, Beaverton, OR (US); Rebecca A. Chierichetti, Brookings, OR (US); Meng Shi, Hillsboro, OR (US); Yevgeniy Y. Yarmosh, Portland, OR (US); Mark R. Francis, Portland, OR (US); Ravishankar Iyer, Portland, OR (US); Reese Bowes, Portland, OR (US); Ankur Agrawal, Seattle, WA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/070,988

(22) Filed: Mar. 15, 2016

(65) Prior Publication Data

US 2017/0269906 A1 Sep. 21, 2017

(51) Int. Cl.
G06F 9/44 (2018.01)
G06F 8/20 (2018.01)
G06F 17/50 (2006.01)

(52) U.S. Cl.
CPC .............. G06F 8/24 (2013.01); G06F 17/50 (2013.01)

(58) Field of Classification Search
CPC .... A63H 2200/00; A63H 13/00; A63H 17/00; A63H 3/52; G06F 3/011; G06F 3/033; G06F 3/04815; G06F 3/04845
See application file for complete search history.

(56) References Cited

U.S. PATENT DOCUMENTS

| 6,741,245 B1 | 5/2004 | Marks et al. |
| 6,939,192 B1* | 9/2005 | Munch ................... A63H 30/04 446/436 |
| 8,754,886 B2 | 6/2014 | Wouhaybi et al. |

(Continued)

OTHER PUBLICATIONS

Glen J. Anderson et al., "Technologies for Physical Programming", International Application No. PCT/US2016/048948, filed Aug. 26, 2016, 36 pages.

(Continued)

*Primary Examiner* — Duy Khuong T Nguyen
(74) *Attorney, Agent, or Firm* — Schwabe, Williamson & Wyatt, P.C.

(57) ABSTRACT

Apparatuses, methods and storage medium associated with a model compute system for physical programming are disclosed herein. In embodiments, an apparatus may include one or more processors, devices, and/or circuitry to identify first rules associated with one or more physical subcomponents, e.g., blocks, tiles, or the like, or combinations thereof, assembled in a constructed model in a first control modality, wherein at least one first rule defines a first predetermined behavior of the constructed model, and determine a first program stack for execution by the model compute system based on the first rules associated with the one or more physical subcomponents. Other embodiments may be described and/or claimed.

25 Claims, 9 Drawing Sheets

(56) References Cited

U.S. PATENT DOCUMENTS

| | | | |
|---|---|---|---|
| 2002/0196250 | A1 | 12/2002 | Anderson et al. |
| 2005/0026537 | A1 | 2/2005 | Hsieh et al. |
| 2007/0063997 | A1 | 3/2007 | Scherer et al. |
| 2011/0298922 | A1 | 12/2011 | Horovitz et al. |
| 2013/0288563 | A1* | 10/2013 | Zheng .................... A63H 3/36 446/268 |
| 2013/0290944 | A1* | 10/2013 | Menon ................ G06F 9/4446 717/168 |
| 2014/0378022 | A1 | 12/2014 | Muthyala et al. |
| 2016/0184724 | A1* | 6/2016 | Butler .................... A63H 3/36 446/484 |
| 2017/0091346 | A1* | 3/2017 | Anderson ............... G06F 17/50 |

OTHER PUBLICATIONS

International Search Report and Written Opinion dated Dec. 7, 2016 for International Application No. PCT/US2016/048948, 14 pages.
Glen J. Anderson et al., "Technologies for Physical Programming", U.S. Appl. No. 14/866,897, filed Sep. 26, 2015, 41 pages.
Office Action dated Oct. 10, 2018 for U.S. Appl. No. 14/866,897, 23 pages.
Timothy Scott McNerney, "Tangible Programming Bricks: An approach to making programming accessible to everyone", 1999. Published Feb. 2000, 86 pages.

* cited by examiner

TECHNOLOGIES FOR PHYSICAL PROGRAMMING

TECHNICAL FIELD

The present disclosure relates to physical programming.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Construction block kits are often used to assemble a wide variety of models and objects. For example, some kits permit the construction of vehicle, characters, and buildings from popular television shows or movies and/or the creation of other well-known objects. In some embodiments, some of the construction blocks allow input and output functions such as making sounds and/or activating lights in response to the user depressing a particular button on the assembled model.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
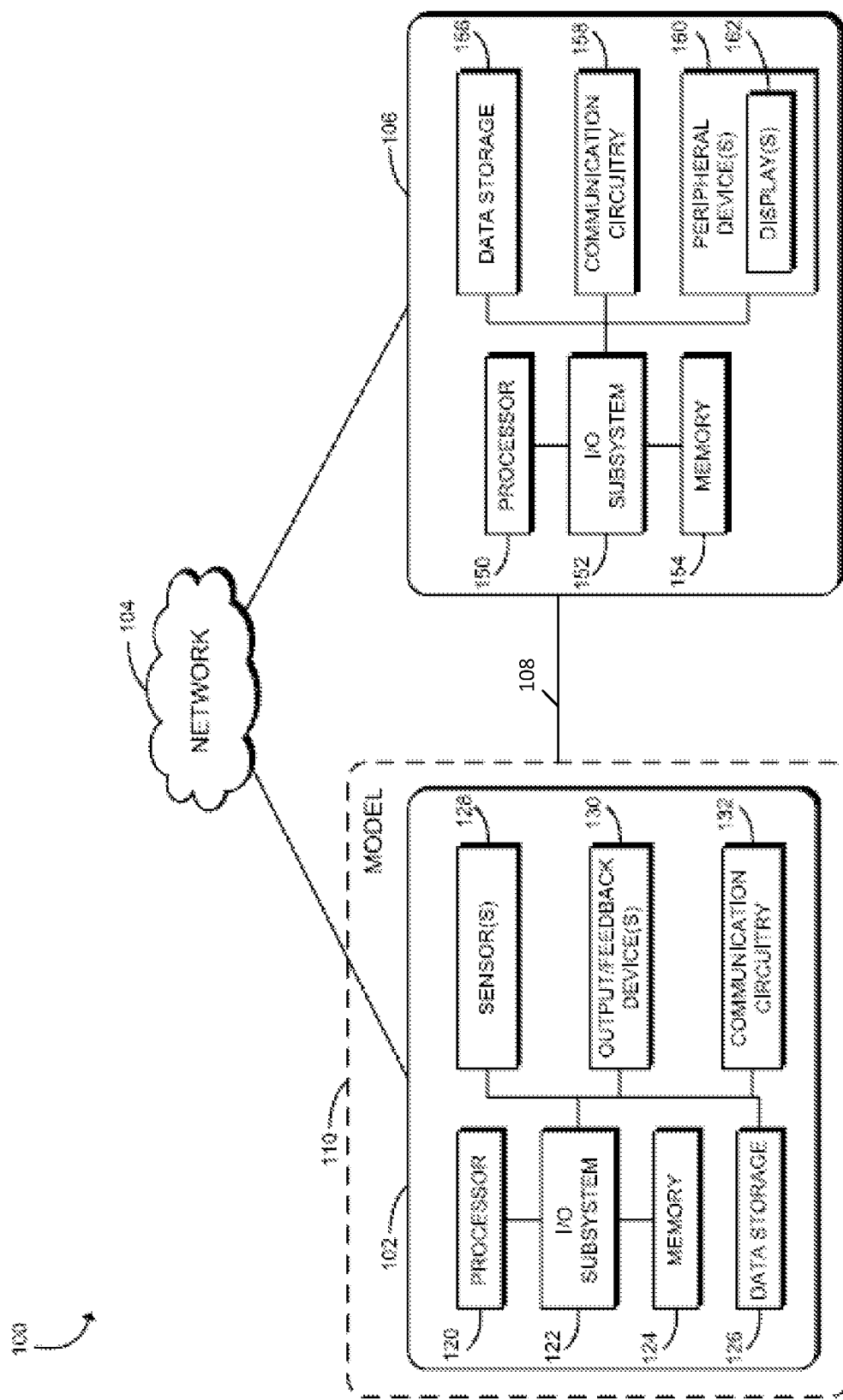
FIG. 1 is a simplified block diagram of at least one embodiment of a system for physical programming, according to various embodiments.

Apparatuses, methods and storage medium associated with a model compute system for physical programming are disclosed herein. In embodiments, an apparatus may include one or more processors, devices, and/or circuitry to identify first rules associated with one or more physical subcomponents, e.g., blocks, tiles, or the like, or combinations thereof, assembled in a constructed model in a first control modality, wherein at least one first rule defines a first predetermined behavior of the constructed model; determine a first program stack for execution by the model compute device based on the first rules associated with the one or more physical subcomponents; and to check for inconsistency between the first program stack and a second control modality.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 is a simplified block diagram of at least one embodiment of a system 100 for physical programming (e.g., a model compute system), according to various embodiments. Referring now to FIG. 1, a system 100 for physical programming may include a model compute device 102 (e.g., a compute device of a physical model) and an administration device 106. The administrative device 106 may be coupled to the model compute device 102 in any fashion, e.g., via Bluetooth or another short range wireless connection, via a network 104, e.g., a Wide Area Network (WAN), or the like, or combinations thereof.

Figure 6:
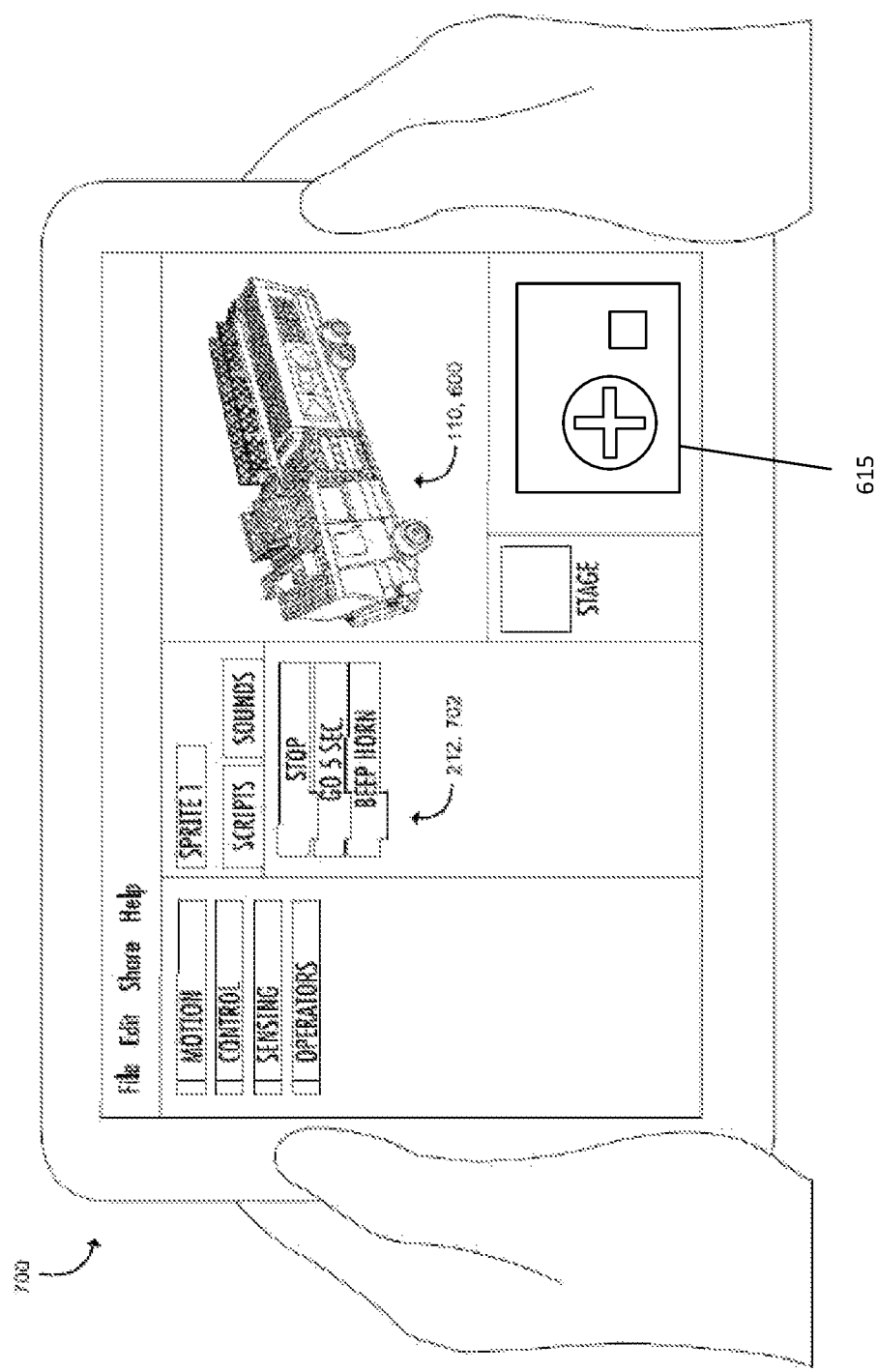
FIG. 6 is a simplified diagram of a graphical user interface of the administration device of FIG. 1, according to various embodiments.

As shown in FIG. 1, the model compute device 102 may be included in a physical model 110, which, in some embodiments, may be assembled by a user from a plurality of physical construction blocks. That is, a user (e.g., a child, parent, instructor, or other user) may assemble a plurality of physical construction blocks into an embodiment of the model 110 as shown in FIG. 6. Of course, at the particular stage of construction, the model 110 may be partially assembled or fully assembled. Further, the particular construction blocks used may be embodied in any physical form factor, may be any geometric shape, and may be constructed from any material suitable for performing the functions described herein and may vary depending on the particular embodiment. In some embodiments, the construction blocks may be embodied as toy construction blocks (e.g., similar in shape/style to toy construction blocks manufactured as Lego® components) that may be secured to one another in various configurations (e.g., to construct a larger object). In other embodiments, one or more of the construction blocks may be embodied, for example, as hats, rings, shoes, figurines, signs, and/or other physical objects. For example, in some embodiments, the construction blocks may be embodied as various clothes, accessories, and/or other accoutrements of a toy doll/soldier.

As described in greater detail below, in some embodiments, the constructed model 110 may include a set of "smart," "action," or "function" physical subcomponents, e.g., blocks (for instance construction blocks), that may affect the behavior of the model and/or a set of standard or "dumb" physical subcomponents (for instance construction blocks) that do not affect the behavior of the constructed model 110. Additionally, some of the physical subcomponents may include output components such as, for example, a motorized axle, speakers, tactile feedback components, and/or other suitable features (e.g., output devices 130). Further, the physical subcomponents may include sensors 128 (e.g., input devices, such as accelerometers, gyroscopes, magnetometers, capacitive or pressure sensitive touch surfaces, and cameras (the camera being 2D, 3d, depth, and/or IR, or the like, or combinations thereof), or the like, or combinations thereof) in some embodiments. As such, it should be appreciated that, in some embodiments, one or more construction blocks may, individually or collectively, include the model compute device 102. That is, in some embodiments, the model compute device 102 may form a portion of (e.g., be distributed across) one or more of the physical blocks of the model 110. In other embodiments, the model compute device 102 may be separate from the model 110 (see, for example, FIG. 5) but capable of identifying the blocks assembled to form the constructed model 110 and/or otherwise perform the functions described herein. In some implementations, at least some components of the model compute device 102 may be part of the administrative device 106, for instance.

As described in detail below, in the illustrative embodiment, the model compute device 102 may be configured to determine which physical construction blocks are assembled in a constructed model at a given point in time (e.g., periodically, continuously, etc.). The model compute device 102 may determine the rule(s), if any, associated with each of the physical blocks of the model. As described below, the rules may define particular behaviors (e.g., actions, functions, correlations, parameters, etc.) of the constructed model and may vary depending on various factors. For example, a particular physical block may be indicative of one behavior under certain circumstances and another behavior under other circumstances. The model compute device 102 may determine a program stack for execution by the model compute device 102 based on the rules associated with the one or more physical blocks in the constructed model. Further, in some embodiments, the administrative device 106 may generate and display a visual representation of the program stack and/or the constructed model on a graphical user interface as described below.

The model compute device 102 may be embodied as any type of computing system or device capable of performing the functions described herein. For example, in some embodiments, the model compute device 102 may be embodied as a microcontroller or other electronic control system. In other embodiments, the model compute device 102 may instead be embodied as a standalone computing device or computing system. For example, in some embodiments, the model compute device 102 may be embodied as a smartphone, cellular phone, wearable computing device, smart watch, smart glasses, implanted/implantable computing device, personal digital assistant, mobile Internet device, tablet computer, netbook, notebook, Ultrabook™, laptop computer, local compute node, and/or any other mobile computing/communication device.

Figure 4:
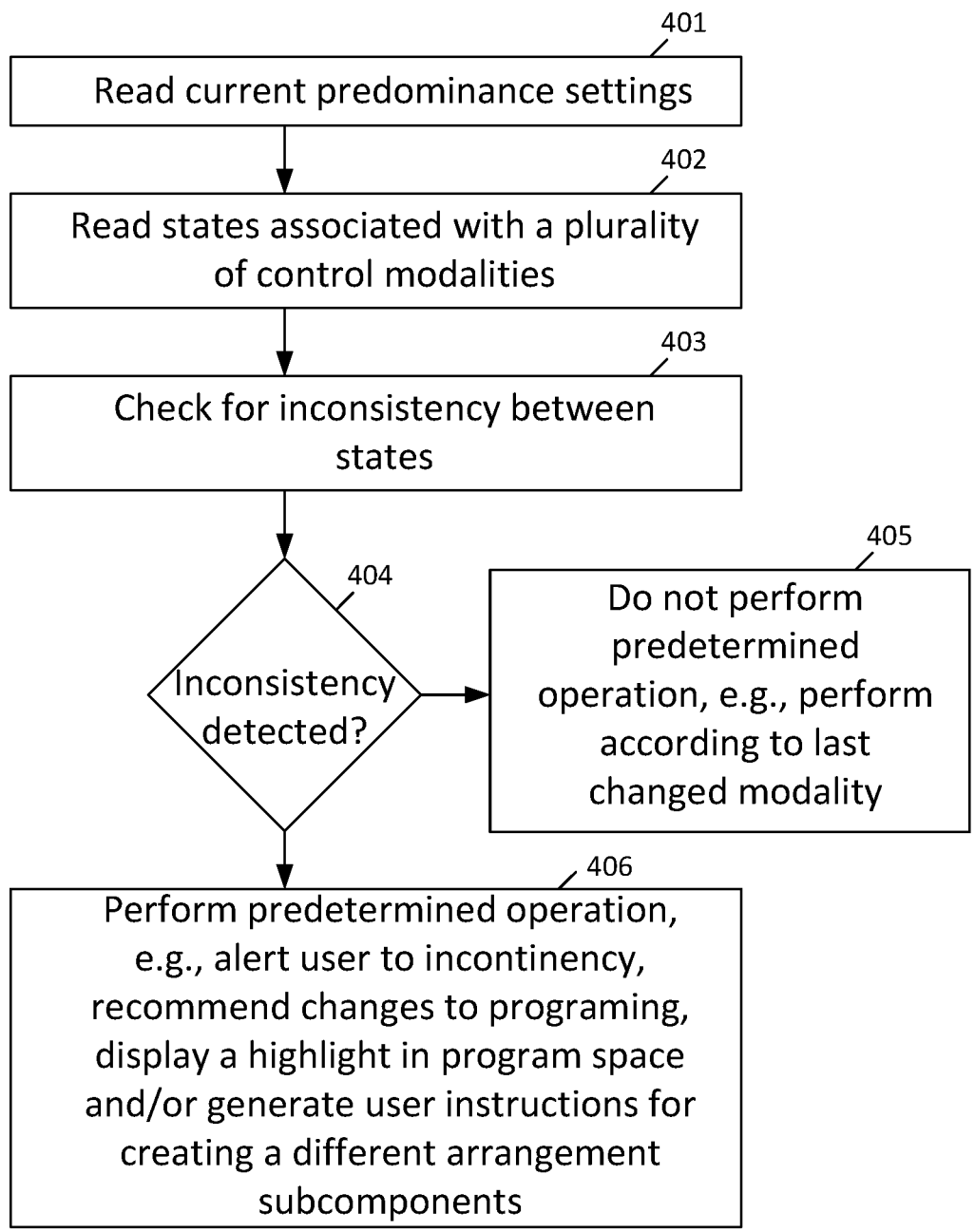
FIG. 4 is a simplified flow diagram of a method for physical programming that may be executed by the system of FIG. 1, according to various embodiments.

In an example, the model compute device 102 may be configured to identify first rules associated with one or more physical blocks assembled in a constructed model in a first control modality, wherein at least one first rule defines a first predetermined behavior of the constructed model. The model compute device 102 may be configured to determine a first program stack for execution by the model compute system based on the first rules associated with the one or more physical blocks. In some implementations, the system 100 may include a predominance module configured to check for inconsistency between the first program stack and a second control modality. FIG. 4 is a simplified flow diagram of a method for physical programming that may be executed by a predominance module of the system of FIG. 1, according to various embodiments. FIG. 4 will be discussed later in greater detail.

Referring again to FIG. 1, in some implementations, the predominance module is of the model compute device 102, which may be integrated with or separate from the model 110. In other implementations, the predominance module is of the administrative device 106. In some implementations, a portion of operations to be performed by the predominance module of the system 100 may be performed by the model 110 or a device coupled to the model, and a portion of the operations are performed by the administrative device 106.

In some implementations, the model of the system 100 may be controlled according to more than one control modality. In an example, a first control modality may include "subcomponent programming" (e.g., physical subcomponent programming), and refers to a movement or output (e.g., light, sound, etc.) of the model 110 controlled by an arrangement and/or assembly of the one or more subcomponent, e.g., physical blocks. In an example, a second control modality may include "software programming", and refers to a coding, for instance a coding accessible using the administration device 106. The coding may be generated at least in part by a user's interactions with a user interface of the administration device 106—or instance dragging and dropping a code element into a code window, coding using a keyboard, or the like, or combinations thereof. The coding may be generated at least in part by physical manipulation of the model 110 and/or providing an input to a sensor of a model, e.g., by lifting the arm of a model bear, by playing music into a microphone of the model 110, or the like, or combinations thereof. In an example, a third control modality may include a remote controller corresponding to the model 110, which may be an RF remote controller coupled (e.g., wirelessly coupled) to the model compute device 102, or a user interface (e.g. a graphical user interface) of the administration device 106.

FIG. 4 is a simplified flow diagram of a method for physical programming that may be executed by the system of FIG. 1, according to various embodiments. In block 401, the system 100 may read current predominance settings. In block 402, the system 100 may read states associated with a plurality of control modalities, e.g., may read a state corresponding to subcomponent programming, may read a state corresponding to software programming, may read a state corresponding to a last remote control input series, or the like, or combinations thereof. In some embodiments, a user interface of the administrative device 106 may enable a user to set one of the modalities to have precedence over another modality. In some embodiments, a default setting may be based on timing, e.g., the last adjustment from the user may control the object's behavior.

In block 403, the system 100 checks for inconsistency between states. If an inconsistency is detected in diamond 404, then in block 406 the system 100 may perform a predetermined action, e.g., the model compute device 102 may alert a user to the inconsistency (e.g., via a display of the administrative device 106), recommend changes to programming (e.g. subcomponent programming or software programming), add a highlight to a program space, and/or generate and display user instructions for creating a different arrangement of subcomponents. In an example, the administrative device 106 may display a message on the user interface of the administrative device 106 to inform the user that a control modality has been overridden. Displayed information may highlight the problem code element(s) to help instruct the user about the inconsistency. Otherwise, the system 100 may not perform the predetermined action, e.g., the model 102 may behave (move, output sound/light, etc.) responsive to the last changed modality.

It should be appreciated that, in some embodiments, if the states are not inconsistent, the first control modalities and the second control modality may work together. For example, commands may be combined across the control modalities to perform a sequence of actions based on the commands of the different control modalities.

Figure 2:
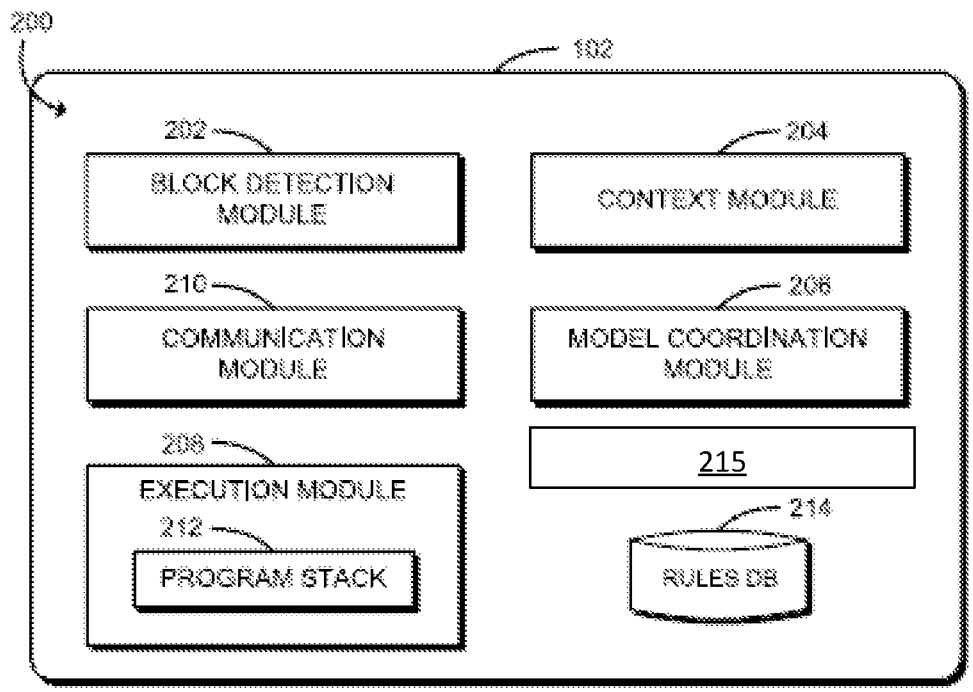
FIG. 2 is a simplified block diagram of at least one embodiment of an environment of a model compute device of the system of FIG. 1, according to various embodiments.

Referring now to FIG. 2, in use, the model compute device 102 may establish an environment 200 for physical programming. The illustrative environment 200 may include a block detection module 202, a context module 204, a model coordination module 206, an execution module 208, a communication module 210, and a predominance module 215 (which may perform some or all of the operations described previously with respect to FIG. 4). The various modules of the environment 200 may be embodied as hardware, software, firmware, or a combination thereof. For example, the various modules, logic, and other components of the environment 200 may form a portion of, or otherwise be established by, the processor 120 or other hardware components of the model compute device 102. As such, in some embodiments, one or more of the modules of the environment 200 may be embodied as circuitry or collection of electrical devices (e.g., a block detection circuitry 202, a context circuitry 204, a model coordination circuitry 206, an execution circuitry 208, a communication circuitry 210 and/or predominance circuitry 215). It should be appreciated that, in such embodiments, one or more of the block detection circuitry 202, the context circuitry 204, the model coordination circuitry 206, the execution circuitry 208, the communication circuitry 210 and/or the predominance circuitry 215 may form a portion of one or more of the processor 120, the I/O subsystem 122, the memory 124, the data storage 126, the sensors 128, the output devices 130, and/or the communication circuitry 132. Additionally, a portion of each of the circuitries described herein may be located on different blocks of the model 110. For example, in some embodiments, the block detection circuitry 202 may include one or more sub-circuits distributed among multiple physical blocks of the model 110. Additionally, in some embodiments, one or more of the illustrative modules may form a portion of another module and/or one or more of the illustrative modules may be independent of one another.

Figure 5:
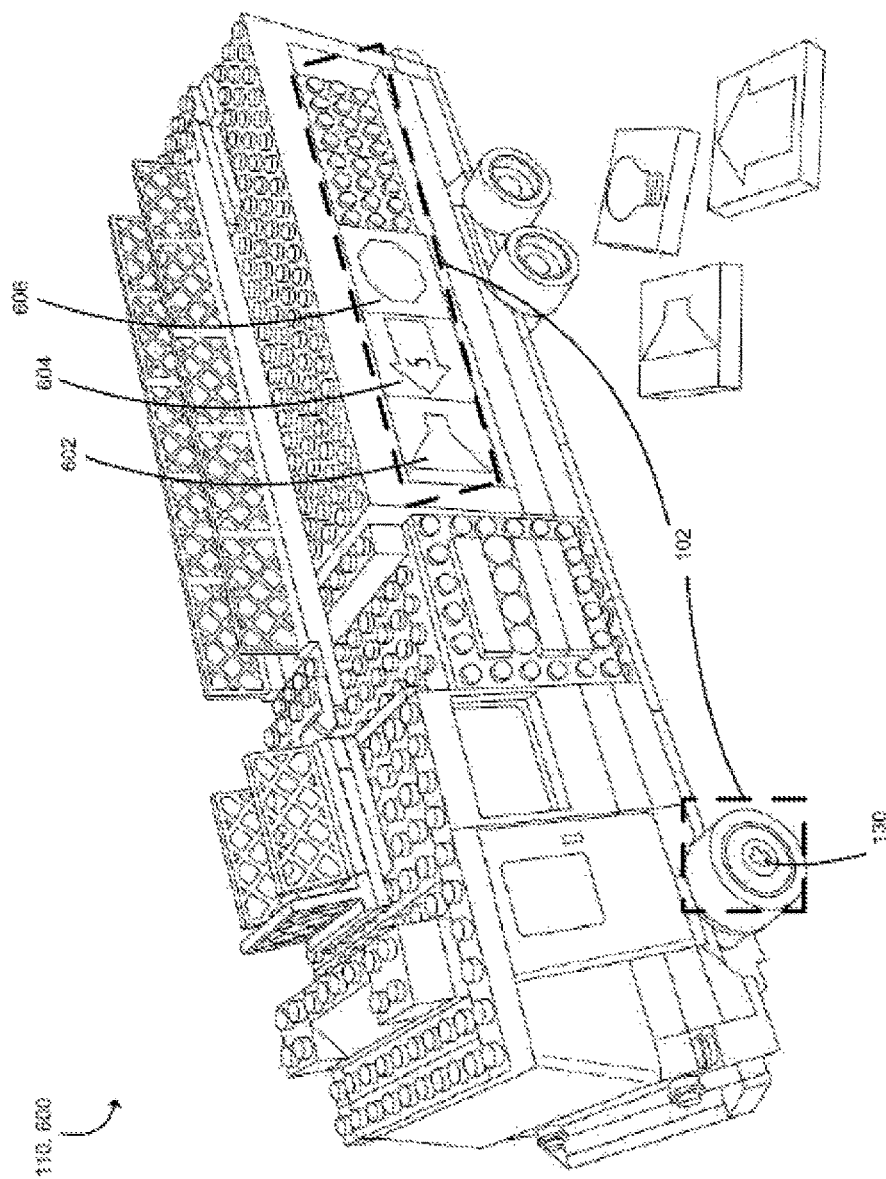
FIG. 5 is a simplified diagram of a constructed model of the system of FIG. 1, according to various embodiments.

As described above, a model 110 may be assembled by connecting individual physical blocks to one another. In some embodiments, one or more of the construction blocks may have a unique identifier and/or be otherwise associated with a rule or set of rules (e.g., defined in a rules database 214) that defines a behavior of the constructed model. Further, in some embodiments, the particular behavior of the model may vary depending on the assembled location of the construction block relative to other construction blocks and/or other contextual data regarding the constructed model. Of course, as described above, some of the construction blocks may be embodied as standard or "dumb" construction blocks. For example, in some embodiments, such "dumb" construction blocks may not affect the behavior of the constructed model 110, whereas other "smart," "action," "function," or "behavior" blocks may affect the behavior of the model 110. It should be appreciated, however, that although the "action" blocks may determine, for example, the movements and sounds of a model 110, those blocks are not necessarily the output blocks/parts of the model 110 that actually have a motor, actuator, or other output component to perform the function. Rather, the "action" blocks may dictate the instructions (e.g., the program stack 212) that are executed by the model compute device 102 to effect action by those output components. For example, as shown in FIG. 5, the user may build a fire engine model 600 with powered wheels (e.g., the output components 130) and add a "beep horn" block 602, a "move for five seconds" block 604, and a "stop" block 606 in a particular order to cause the fire engine model 600 to perform the corresponding functions when the resulting program stack 212 is executed by the model compute device 102. Although the blocks 602, 604, 606 are shown as tiles secured to a side of the model 600, it should be appreciated that the blocks 602, 604, 606 may be otherwise formed and/or positioned in another embodiment (e.g., as more integral building blocks of the fire engine model 600).

The block detection module 202 may be configured to determine which physical construction blocks are assembled in a constructed (e.g., fully or partially constructed) model 110 at a given point in time (e.g., periodically, continuously, in response to the satisfaction of some condition, etc.). Further, the block detection module 202 may determine the position at which the construction blocks are assembled relative to one another and/or relative to another reference point (e.g., an order in which the construction blocks are secured to one another in a physical stack of blocks, etc.). It should be appreciated that the model compute device 102 may utilize any suitable technique, algorithm, and/or mechanism for doing so. For example, in some embodiments, the block detection module 202 may determine or identify physical connections (e.g., electrical connections, electromechanical connections, electromagnetic connections, etc.) between one or more constructions blocks based on self-reporting of such connections to the block detection module 202. At least one embodiment of determining how construction blocks are assembled relative to one another based on electrical/electromechanical connections between the construction blocks is described in U.S. Patent Application Publication No. 2002/0196250 by Anderson et al. In some embodiments, the block detection module 202 may utilize sensors 128 embedded in the construction blocks and/or located external to the construction blocks (e.g., cameras) to identify the physical blocks and/or determine the position of the blocks relative to one another. At least one embodiment of doing so is described in U.S. Pat. No. 8,754,886 by Wouhaybi et al. It should be appreciated that, in some embodiments, one or more of the construction blocks (e.g., each block) may include or be associated with a particular identifier (e.g., a unique identifier). Further, as described in greater detail below, the positions of the construction blocks relative to one another may affect the behavior of the assembled/constructed model 110. For example, in one embodiment, a first order of a set of blocks may be indicative of a first behavior of the model 110, whereas another order of the same set of blocks may be indicative of a different behavior of the model 110 (e.g., based on rules associated with the corresponding blocks as defined in the rules database 214).

The context module 204 may determine the context of the model compute device 102 based on, for example, sensor data generated by the sensors 128 (e.g., hardware and/or software sensors) and/or other suitable data of the model compute device 102. For example, in some embodiments, the context module 204 may determine characteristics regarding the physical environment of the model 110, the location of the model 110, other compute systems/devices to which the model compute device 102 is communicatively coupled (e.g., other nearby model compute devices within the vicinity of the model 110), the current time, and/or other suitable contextual information.

The model coordination module 206 may be configured to determine rules associated with the physical construction blocks in the assembled model 110. As indicated above, each of the blocks may be associated with one or more rules that define behaviors (e.g., actions, functions, correlations, parameters, etc.) of the model 110. Further, it should be appreciated that the rules for a particular construction block may be indicative of one behavior in certain circumstances and another behavior in different circumstances. For example, the behavior may vary depending on the presence of (or lack of) one or more other blocks in the model 110, how the block is positioned relative to other blocks (e.g., whether it is in a particular sequence), whether the behavior is overridden by another block (e.g., a "global" control block), inherited behaviors from other blocks, etc. The model coordination module 206 may generate a program stack 212 for execution by the model compute device 102 based on the rules associated with the construction blocks. For example, in some embodiments, the model coordination module 206 may determine a program stack 212 that may include high-level or low-level functions to be performed by the model 110 based on the assembled model and the rules of the corresponding blocks. Of course, in some embodiments, the program stack 212 may include flow control statements (e.g., go to, while, for-next, if-then, switch, and/or other flow control statements), which may associated with a particular construction block or otherwise generated/determined. For example, a particular block may represent a repeat of actions that corresponds with a loop control statement in the program stack 212, thereby causing the model 110 to repeat one or more behaviors a number of times (e.g., a predefined or condition-based number). In some embodiments, the particular behavior(s), number of repeated actions, and/or related conditions may be determined by the particular block or a user edit of the program stack 212. Additionally, one or more of the blocks in the model 110 may be embodied as a "time" block that indicates a particular behavior (e.g., behavior of the "previous" block) is to occur for a certain period of time (e.g., move forward for five seconds), which may be appropriately incorporated in the program stack 212 (e.g., as a function parameter). Further, in some embodiments, one or more blocks may correspond with other functions or subroutines in the program stack 212 that cause the administration device 106 to retrieve a random number to direct the model 110 to operate for a given time period.

The execution module 208 may be configured to execute the program stack 212. That is, the execution module 208 may be configured to operate the constructed model 110 based on the functions set forth in the program stack 212. It should be appreciated that, depending on the particular embodiment, the execution module 208 may determine to operate the constructed model 110 in response to the occurrence of some action (e.g., in response to the user of the model 110 depressing a particular button), in response to the satisfaction of some condition (e.g., in response to receiving a message from another model 110, in response to determining the model 110 is at a particular location, or in response to other contextual criteria), and/or in another suitable way. Of course, in some embodiments, less than the entirety of the program stack 212 may be executed for a given execution sequence. For example, in an embodiment, the execution module 208 may execute a first set of functions defined in the program stack 212 without executing other functions defined in the program stack 212 (e.g., conditional functions).

The communication module 210 may be configured to handle the communication between the model compute device 102 and other compute devices of the system 100 (e.g., the administration device 106 and/or a remote compute device). For example, as described herein, the model compute device 102 may report model data indicative of the program stack 212 to the administration device 106, which may generate and display a visual representation of the program stack 212 for viewing by the user of the administration device 106 (e.g., the user of the model 110). It should be appreciated that the particular model data transmitted may vary depending on the particular embodiment. For example, in some embodiments, the communication module 210 may transmit the program stack 212 to the administration device 106 whereas, in other embodiments, the communication module 210 may transmit other model data that may be utilized by the administration device 106 to regenerate the program stack 212.

The predominance module 215 may be configured to perform at least some of the operations described with respective to FIG. 4, in examples where the system 100 includes more than one control modalities for the model 102, e.g., at least two of subcomponent programming, software programming, control via a remote controller, or the like. In some examples, the predominance module 215 may allow a user to select whether one of the control modalities overrides another one of the control modalities. Depending on user settings, the predominance module 215 may cause the system 100 to display a query to the user for modifications to one control modality, e.g., an addition to one control modality, to be consistent with another control modality.

In an example, the user settings may correspond to only a subset of possible inconsistencies. For example, in a system with three modalities, e.g., subcomponent programming, software programming, and remote controller), the user settings may specify that the remote controller has precedence over programming. Therefore, in detecting inconsistency between the remote controller and programming, the predominance module 215 may automatically have the remote controller determine the behavior of the model 102. The predominance module 215 may also initiate a message on a user interface of the system 100 to inform a user that a programming control modality has been overridden. However, in detecting inconsistency between programming control modalities (e.g. subcomponent and software), the predominance module 215 may respond different, for instance by wait for a user input to a displayed message and, before overriding one programming control modality over the other programming control modality.

The predominance module 215 may highlight the "problem" element of a programming control modality on a user interface in the event of an inconsistency. This highlighting may help instruct the user about the inconsistency. The predominance module 215 may generate express text instructions to recommend changes to the subcomponent programming, in addition to or in alternative to the highlighting.

In an example, the predominance module 215 may be configured to track a current set of commands resulting from subcomponent programming, software programming, and the remote controller. The predominance module 215 may be configured to detect an inconsistency responsive to the tracking, and check user settings responsive to detecting an inconsistency. The predominance module 215 may include a rule set and a user interface for setting and tracking the current desired predominance for behavior of the model 102. The predominance module may be configured to apply the rules of the rules set to determine the behavior of the model 102. The rule set may be a configurable rule set to govern how to respond in the event on an inconsistency (for example, the addition of a command or step on a user interface for software programming, where the command or step is not represented by any subcomponents on the model 102, or the addition of a subcomponent on the model 102 that contradicts a command or step already included in the software programming). The rule set may include a scheme to provide a user access to make a given one of the rule sets a current rule set, e.g., specify a predominance setting. The predominance module may determine that a sequence of commands is created that combines the commands from two or more modalities.

Figure 3:
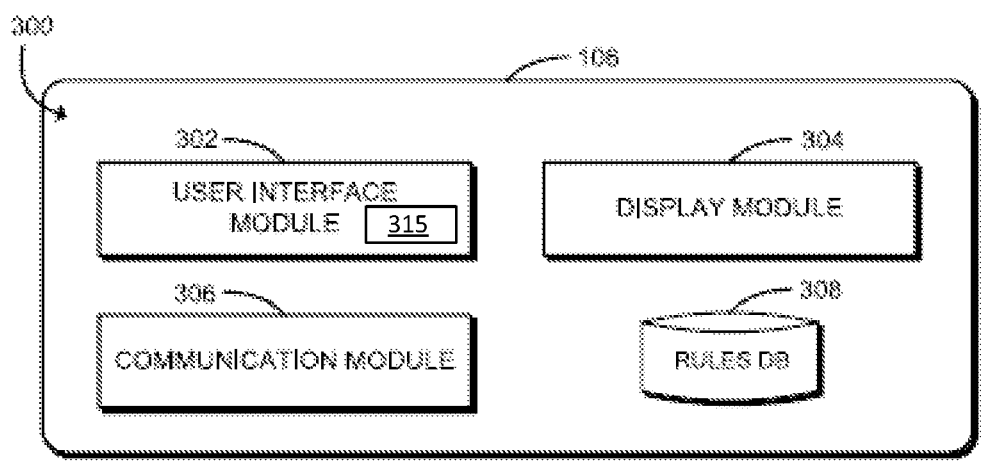
FIG. 3 is a simplified block diagram of at least one embodiment of an environment of an administration device of the system of FIG. 1, according to various embodiments.

Referring now to FIG. 3, in use, the administration device 106 may establish an environment 300 for visually representing physical programming. The illustrative environment 300 may include a user interface module 302, a display module 304, and a communication module 306. The various modules of the environment 300 may be embodied as hardware, software, firmware, or a combination thereof. For example, the various modules, logic, and other components of the environment 300 may form a portion of, or otherwise be established by, the processor 150 or other hardware components of the administration device 106. As such, in some embodiments, one or more of the modules of the environment 300 may be embodied as circuitry or collection of electrical devices (e.g., a user interface circuitry 302, a display circuitry 304, and/or a communication circuitry 306). It should be appreciated that, in such embodiments, one or more of the user interface circuitry 302, the display circuitry 304, and/or the communication circuitry 306 may form a portion of one or more of the processor 150, the I/O subsystem 152, the memory 154, the data storage 156, the communication circuitry 158, and/or the peripheral devices 160. Additionally, in some embodiments, one or more of the illustrative modules may form a portion of another module and/or one or more of the illustrative modules may be independent of one another.

Figure 7:
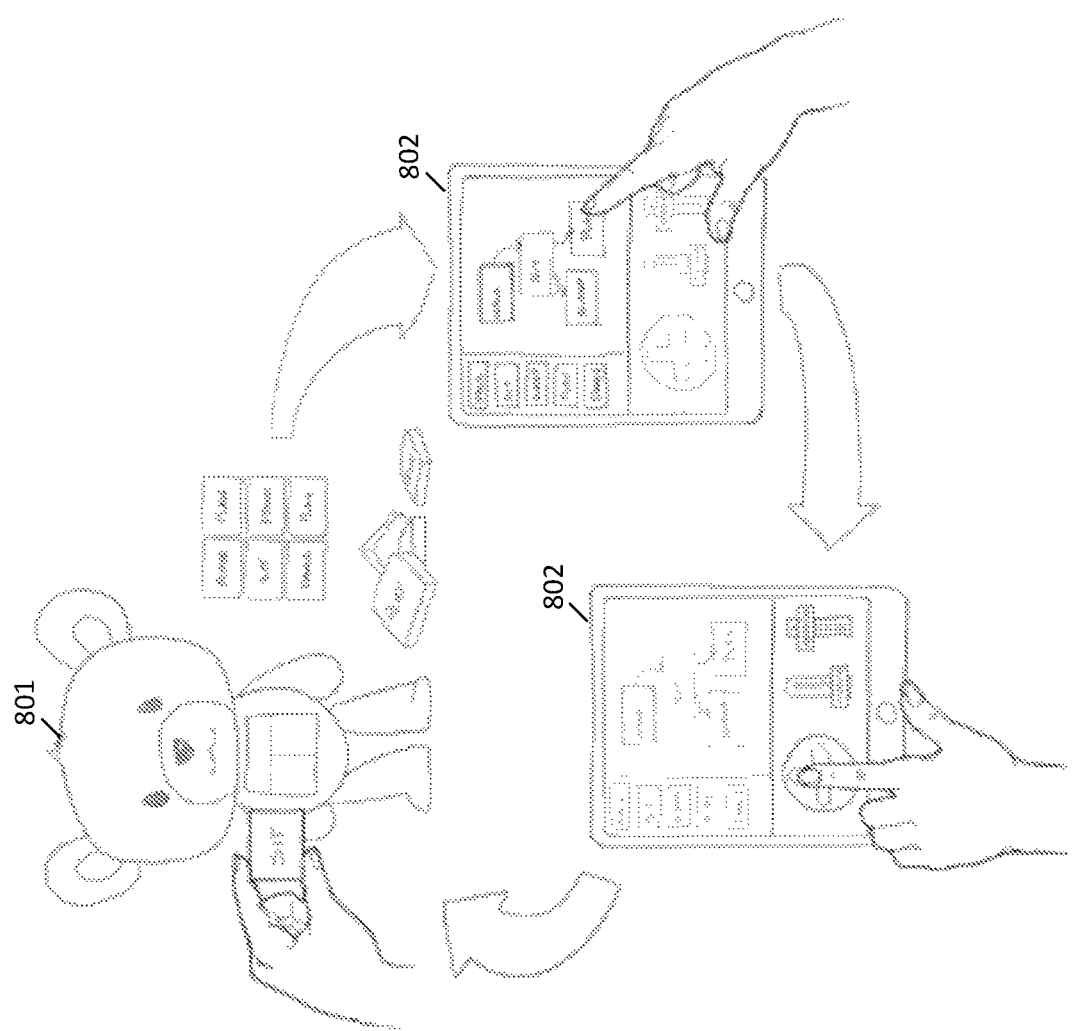
FIGS. 7-9 are simplified block diagrams of another embodiment of a system for physical programming, according to various embodiments.

The user interface module 302 may be configured to generate a graphical user interface for viewing by the user of the administration device 106 (e.g., the user of the model 110). For example, in the illustrative embodiments, the user interface module 302 may generate a visual representation of the program stack 212 (e.g., received from the model compute device 102 or based on other model data received from the model compute device 102) that is to be executed by the model. Further, in some embodiments, the user interface module 302 may generate a visual representation of the constructed model 110. For example, as shown in FIG. 7, the user interface module 302 may generate a graphical user interface 700 for contemporaneous display of a visual representation of the fire engine model 600 and the corresponding program stack 702. In the illustrative embodiment of the graphical user interface 700, the program stack 702 may include functions/instructions corresponding with the "beep horn" block 602, the "move for five seconds" block 604, and the "stop" block 606 as described above.

In some examples, the user interface module 302 may include a remote control interface module 315. In an example, the remote control interface module 315 is configured to cause a graphical remote control interface 615 (FIG. 6) for contemporaneous display a visual representation of the fire engine model 600 and the corresponding program stack 702.

It should be appreciated that the ability to simultaneously view the constructed model 110 and corresponding program stack 212 may improve the user's understanding of the physical programming associated with the model 110 as constructed. For example, the user may experiment with the relative positioning of physical blocks, the addition/deletion of blocks, and/or other modifications to the constructed model 110 to determine the corresponding physical programming program stack 212. In some embodiments, the user interface module 302 may further permit the user to interact with and/or provide feedback to the administration device 106. For example, in some embodiments, the user may modify the visual representation of the model 110 to effect a change in the corresponding program stack 212. Accordingly, in some embodiments, the administration device 106 may also include a rules database 308, which may be a copy of the rules database 214 and/or may include more control rules corresponding to a rule set of the remote controller control modality). The display module 304 may be configured to render images on a display 162 of the administration device 106. For example, as discussed above, the display module 304 may display a graphical user interface including a visual representation of the program stack 212 and/or the constructed model 110.

The communication module 306 may be configured to handle the communication between the administration device 106 and other compute devices of the system 100 (e.g., the model compute device 102 and/or a remote compute device). For example, as described above, the administration device 106 may receive model data (e.g., the program stack 212) indicative of a desired behavior of a constructed model 110. Additionally, in some embodiments, the administration device 106 may receive data indicative of the positions of the blocks relative to one another (e.g., for display of the visual representation of the model 110). Further, in some embodiments, the communication module 306 may transmit the model data and/or other data to a remote compute device.

Figure 8:
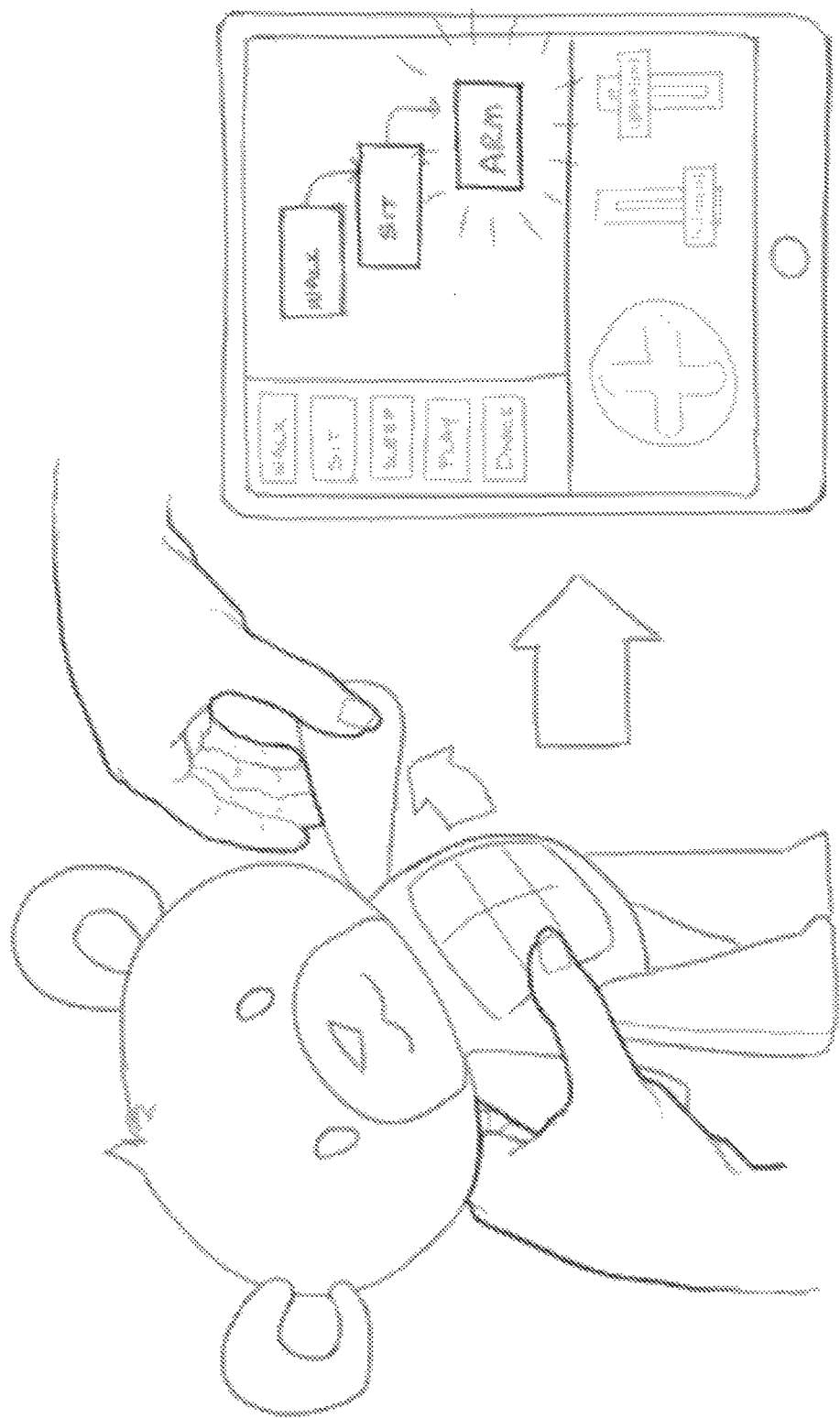
Figure 9:
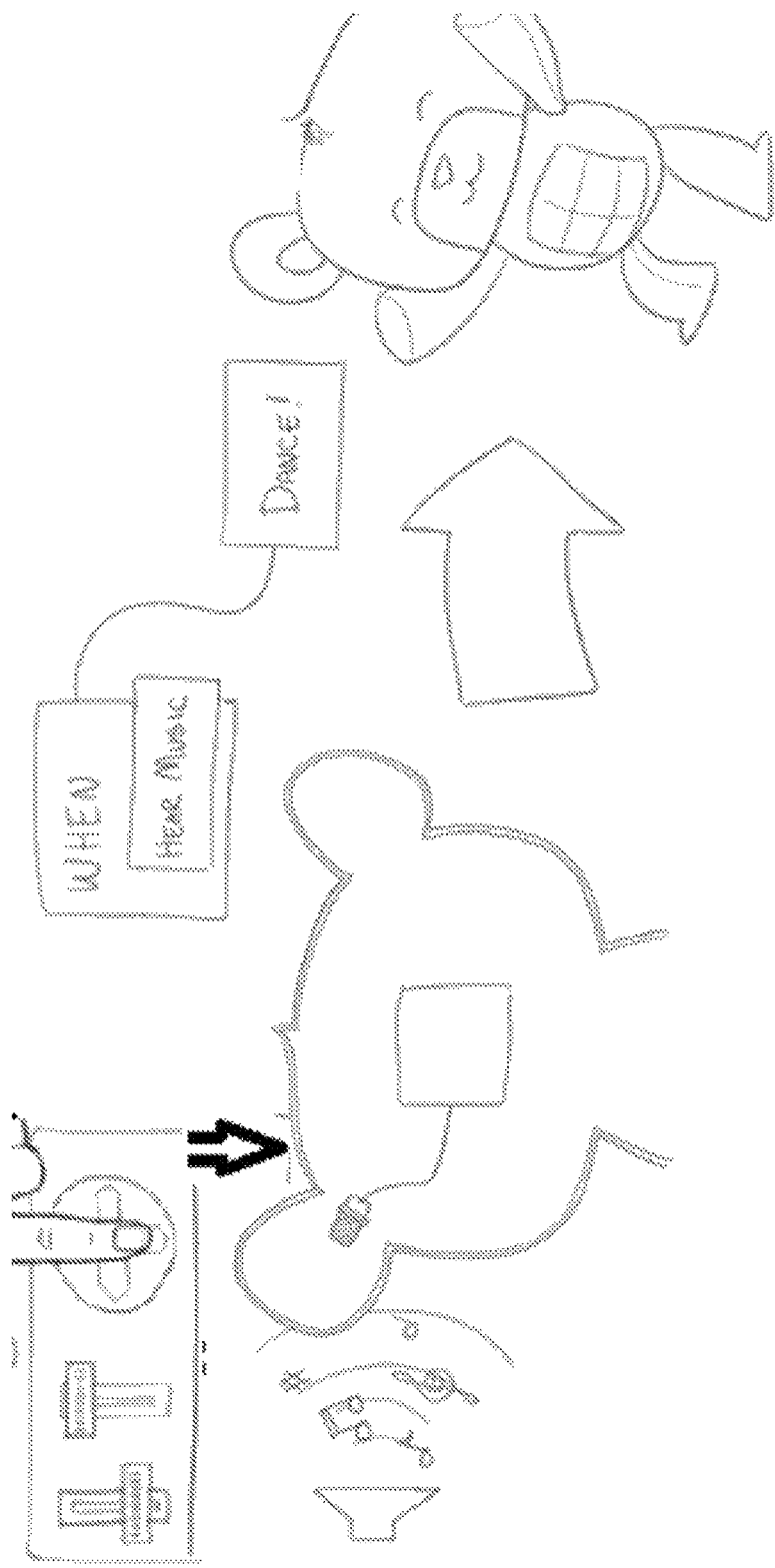

FIGS. 7-9 are simplified block diagrams of another embodiment of a system for physical programming, according to various embodiments.

The model 801 is a toy bear with an attachment region to receive subcomponents, e.g., physical programming tiles, and the administration device 802 displays a graphical user interface similar to the previously described graphical user interface (e.g., the graphical user interface may include a contemporaneous display of a program stack and a graphical user interface remote controller). The administration device 802 may include a Scratch™-like user interface to edit or build a program stack.

The diagram shows the user interacting with the model 801 and administration device 802 to control the model 801 according to the three control modalities of subcomponent programming, software programming, and a remote controller. The user may place the physical tiles on the model 802 to create subcomponent programming that may control the model 801. The user may use the user interface corresponding to the program stack display to build a software programming that may control the model 801. The user may operate the graphical user interface remote controller to control the model 801.

Referring to FIG. 8, the user may physically manipulate the model 801 to change the software programming. The model 801 in the illustrated example may include a senor to detect physical manipulation of the arm of the model 801, and the model 801 may be configured to cause the software programming to include a corresponding command to activate a movement mechanism of the model 801 for the arm.

Referring to FIG. 9, the user may use the graphical user interface remote controller to activate a microphone of the model 801 (e.g. turn on the microphone) while controlling a movement of the bear, e.g., making the bear dance. The system may modify the current program stack responsive to the inputs over the graphical user interface remote controller (for example the system may automatically add corresponding rules to the current program stack responsive to the input). The new program stack created responsive to the input to the graphical user interface remote controller may be configured to command the bear to dance responsive to the microphone detecting an audio pattern similar to an audio pattern input to the activated microphone. If the new program stack is executed at a later time on the model 801 or another similar model, the model will dance if the microphone of the model detects an audio pattern corresponding to the music.

In an example, a user interface of an administration device for a system including a module compute device for physical programming may display a graphical user interface remote controller and a program space to display a current program stack. In another example, the administration device may receive signals directly from a separate remote controller (e.g. a smart phone, a discrete remote controller, etc.), or receive information from the model compute device based on signals received by the model compute device.

In an example, a system may include a plurality of control modalities, e.g., subcomponent programming, software programming, and remote control may control a model.

In an example, the user interface of the administrative device may be configured to enable users to drag and drop elements from a list of available commands to a program space, or to a contemporaneously displayed graphical user interface remote control (the administrative device may be configured to transmit a corresponding remote control signal responsive to the selected available command being added (e.g. dragged and dropped) to the program space).

In an example, depending on settings, the system may query a user for additions to one modality to be consistent with another modality.

In an example, the system may be configured to perform a program addition to an existing program (e.g. a current program of the program space) responsive to transmission and/or reception of a respective on of a plurality of remote control signals to, or by, the model. In an example, the system may be configured to perform a program addition to an existing program (e.g. a current program of the program space) responsive to the detection of physical manipulation of the model by a respective sensor of a plurality of sensors of the model.

In an example, the model compute device may include embedded sensors, such as a 2d camera, a 3d camera, a depth sensor, an Infra-Red (IR) sensor, a microphone, a motion sensor, or the like, or combinations thereof. In an example, the system may be configured to correlate a program addition of available program additions to an input of one of the sensors, and the correlated program addition may be added to an existing program.

In an example, the subcomponents (e.g., blocks, tiles, or the like), may include sensors. In an example, the sensor may include a touch sensor. The system may be configured to operate according to a control modality based on the touch sensors, e.g., the model may turn left, turn right, stop, start, move faster, move slower, or the like, or combinations thereof, responsive to actuation of a respective one or the touch sensors. The program space of the user interface may be configured to customize associations between subcomponents and behaviors.

In an example, the subcomponents may include output interfaces, e.g., an e-ink screen, vibration, or the like, or combinations thereof.

In an example, the system may be configured to determine an execution order for program elements corresponding to the subcomponents based on a position of the subcomponents on the model, the temporal order that the subcomponents are placed on the model, voice commands, via input into the graphical user interface of the administration device, via a user interface of a subcomponent (e.g. a subcomponent may include a touch screen on the subcomponent, or a remote user interface of the subcomponent may communicate wirelessly with the subcomponent and/or any other device of the system, such as the model compute device), or the like, or combinations thereof. In one example, the user interface of the subcomponent may be detachably connected to the subcomponent, which may enable the use of a relatively expensive user interface to be utilized with more than one model.

In an example, the user interface of the administration device may be configured to apply programs to different models. For instance, a user may build the program on the administrative device, and then make a command to forward that program to a model that repeats the program.

In an example, an addition to a current program space responsive to an input of a sensor of the model may by visible on the user interface of the administration device.

In an example, a user interface of the administration device may be configured to allow re-assignment of a behavior to a particular sub-component. The system may store information including attributes correspondingly associated to identifiers (e.g. unique identifiers) of the subcomponents. The attributes may include duration, direction, or speed or movement, or the like, or combinations thereof. The user of the administration device may include an input to allow an attribute to be changed or added to one of the identifiers. In an example, the user may create a sequence of behaviors—move, right, right, left, stop (using the attributes), and assign the sequence to one of the sub-components. In an example, a user may create a physical programming subroutine using these attributes.

In an example, the remote controller actions of a graphical user interface remote controller of the administration device may be programmable. A user may add voice input, gesture input (air, device, touch, etc.), or other inputs to be usable (e.g. drag and drop) to the program space and/or the graphical user interface remote controller.

In an example, the system may include savable programs that may include holding places for the subcomponents if the subcomponents are not on the model when the program is loaded. These savable programs may be applied to compatible models to perform the same programmed behaviors.

In an example, the system may be configured to save multi-step commands enabled by automatic reprogramming of the inputs (e.g. keys) of the remote controller.

In an example, the user interface of the administration device may be fully or partially voice-controlled.

In an example, the system may be configured to automatically reprogram an input of the remote controller and/or a command on the remote controller responsive to changes of programming (e.g., physical or software).

In an example, the system may be configured to enable re-programming of the remote controller to correspond to different desired actions of the model. Instructions from the re-programmed remote controller may be translated by the system into software programming, which may be included in the program space.

In an example, a marketplace (e.g. a digital marketplace) for the sharing and exchange of videos of newly created programs and the corresponding behavior of the toy may be provided.

In an example, a marketplace (e.g., a digital marketplace) for the sharing, exchange, and sale of programming applications created using the system may be provided.

In an example, the behavior, play, and programming with the model can be performed from physical distant locations using the administration device or a remote electronic device coupled to the administration device over the Internet.

Figure 10:
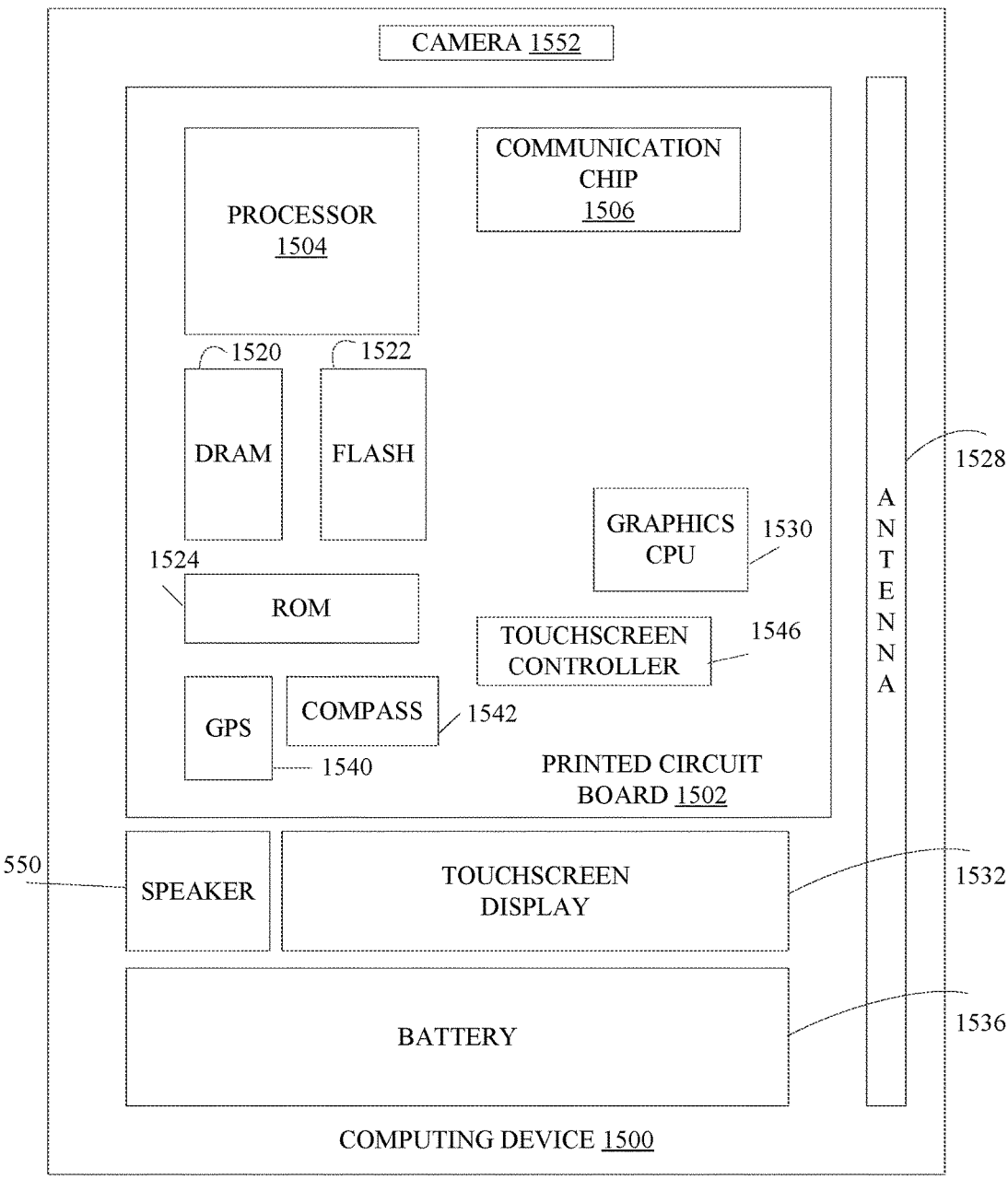
FIG. 10 illustrates an example computing device that may employ the apparatuses and/or methods described herein, according to various embodiments.

FIG. 10 illustrates an example computing device that may employ the apparatuses and/or methods described herein, according to various embodiments.

Example computing device 1500 may employ the apparatuses and/or methods described herein, in accordance with various embodiments. As shown, computing device 1500 may include a number of components, such as one or more processor(s) 1504 (one shown) and at least one communication chip 1506.

In various embodiments, the one or more processor(s) 1504 each may include one or more processor cores. In various embodiments, the at least one communication chip 1506 may be physically and electrically coupled to the one or more processor(s) 1504. In further implementations, the communication chip 1506 may be part of the one or more processor(s) 1504. In various embodiments, computing device 100 may include printed circuit board (PCB) 1502. For these embodiments, the one or more processor(s) 1504 and communication chip 1506 may be disposed thereon. In alternate embodiments, the various components may be coupled without the employment of PCB 1502.

Depending on its applications, computing device 1500 may include other components that may or may not be physically and electrically coupled to the PCB 1502. These other components include, but are not limited to, a memory controller (not shown), volatile memory (e.g., dynamic random access memory (DRAM) 1520), non-volatile memory such as read only memory (ROM) 1524, flash memory 1522, an I/O controller (not shown), a digital signal processor (not shown), a crypto processor (not shown), a graphics processor 1530, one or more antenna 1528, a display (not shown), a touch screen display 1532, a touch screen controller 546, a battery 1536, an audio codec (not shown), a video codec (not shown), a global positioning system (GPS) device 1540, a compass 1542, an accelerometer (not shown), a gyroscope (not shown), a speaker 1550, a camera 1552, and a mass storage device (such as hard disk drive, a solid state drive, compact disk (CD), digital versatile disk (DVD)) (not shown), and so forth.

In some embodiments, the one or more processor(s) 1504, flash memory 1522, and/or a storage device (not shown) may include associated firmware (not shown) storing programming instructions configured to enable computing device 1500, in response to execution of the programming instructions by one or more processor(s) 1504, to practice all or selected aspects of the methods described herein. For example, the programming instructions may implement the earlier described modules with references to the respective ones of FIGS. 1-9. In various embodiments, these aspects may additionally or alternatively be implemented using hardware separate from the one or more processor(s) 1504, flash memory 1512, or storage device 1511.

The communication chips 1506 may enable wired and/or wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 5G, 5G, and beyond. The computing device 1500 may include a plurality of communication chips 1506. For instance, a first communication chip 1506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others (e.g., developed or yet to be developed).

In various implementations, the computing device 1500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, a digital video recorder, or the like, or combinations thereof. In further implementations, the computing device 1500 may be any other electronic device that processes data.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Examples

Example 1 is a system for physical programming for a model compute device. The system may include one or more processors; and a model coordination module to be operated by the one or more processors to: identify first rules associated with one or more physical subcomponents assembled in a constructed model in a first control modality, wherein at least one first rule defines a first predetermined behavior of the constructed model; determine a first program stack for execution by the model compute device based on the first rules associated with the one or more physical subcomponents; and a predominance module to be operated by the one or more processors to check for inconsistency between the first program stack and a second control modality.

Example 2 includes the subject matter of example 1, and the second control modality corresponds to at least one of a sensor to detect a physical manipulation, by a user, of the model.

Example 3 includes the subject matter of any of examples 1-2, and the sensor includes a microphone.

Example 4 includes the subject matter of any of examples 1-3, and the predominance module is generate a recommendation to re-construct the constructed model in response to detection of an inconsistency between a remote control input and the first program stack.

Example 5 includes the subject matter of any of examples 1-4, and the recommendation includes a user instruction for re-assembly of the one or more physical subcomponents.

Example 6 includes the subject matter of any of examples 1-5, and the predominance module is to generate second program stack that is different than the first program stack in response detection of an inconsistency between a remote control input and the first program stack.

Example 7 includes the subject matter of any of examples 1-6, and a programming user interface module to be operated by the one or more processors to: identify second rules associated with one or more expressions in said second control modality, wherein at least one second rule defines a second predetermined behavior of the constructed model; and determine a second program stack for execution by the model compute device based on the second rules associated with the one or more expressions.

Example 8 includes the subject matter of any of examples 1-7, and the second control modality corresponds to at least one of a remote controller or a remote control graphical user interface.

Example 9 includes the subject matter of any of examples 1-8, and a user interface to allow a user to edit the first program stack; wherein the model coordination module is to generate a second program stack that is a modification of the first program stack responsive to an input received over at least one of an internal bus, a network, or a short range wireless connection, the input originating from the user interface.

Example 10 includes the subject matter of any of examples 1-9, and a detection module to be operated by the one or more processors to detect a physical manipulation of the constructed model; wherein the model coordination module is to generate a second program stack responsive to detection of physical manipulation of the constructed model independently of the remote control input.

Example 11 is a computer-readable medium having instructions for implementing physical programming stored thereon that, in response to execution by a processing device, cause the processing device to perform operations, to: determine a first program stack for execution by a model compute device based on first rules associated with one or more physical subcomponents assembled in a constructed model in a first control modality, wherein at least one first rule defines a first predetermined behavior of the constructed model; access a value of a predominance setting in response to receiving an input, of a second control modality, that is not consistent with the first program stack; and determine whether an action is to be performed by the constructed model based on the value of a predominance setting.

Example 12 includes the subject matter of example 11, and the operations are further to display, by the module compute system, a user notification based on the value of the predominance setting, wherein the user notification includes a user instruction for re-assembly of the one or more physical subcomponents.

Example 13 includes the subject matter of any of examples 11-12, and the operations are further to perform at least one of display a user interface to configure the value of the predominance setting or acquire the predominance setting over at least one of a network or a short range wireless connection.

Example 14 includes the subject matter of any of examples 11-13, and the operations are further to re-associate the first rules and the one or more physical subcomponents or associate a new rule to a physical subcomponent of the one or more physical subcomponents.

Example 15 includes the subject matter of any of examples 11-14, and the operations are further to: determine a position of one of the one or more physical subcomponents relative to at least one other physical subcomponent of the one or more physical subcomponents; and cause a user notification to be displayed at least one of locally or remotely responsive to the predominance setting and based on the determined position.

Example 16 is a method of physical programming for a model compute device, the method comprising: determining, by a module compute system, a first program stack for execution based on first rules associated with one or more physical subcomponents assembled in a constructed model in a first control modality, wherein at least one first rule defines a first predetermined behavior of the constructed model; accessing, by the module compute system, a value of a predominance setting in response to receiving an input, of a second control modality, that is not consistent with the first program stack; and determining whether an action is to be performed by the constructed model responsive to the value of the predominance setting.

Example 17 includes the subject matter of example 16, further comprising: contemporaneously displaying, by the module compute system, a plurality of program spaces; detecting, by the module compute system, a user input corresponding to an addition of a command to the plurality of program spaces; in response to an addition of the command to the first program space, immediately controlling, by the module compute system, a physical movement of the constructed model or an output by the constructed model; and in response to an addition of the command to the second program space, generating, by the module compute system, a second program stack that is different than the first program stack.

Example 18 includes the subject matter of any of examples 16-17, and further comprising: in response to a user input to execute the second program stack, controlling, by the module compute system, the physical movement of the constructed model or the output by the constructed model.

Example 19 includes the subject matter of any of examples 16-18, and the first program space corresponds to a remote controller.

Example 20 includes the subject matter of any of examples 16-19, and further comprising: displaying, by the module compute system, a plurality of commands associated with the first rules; displaying, by the module compute system, a program space and a remote control space; displaying, by the module compute system, a user interface to add a user selected one of the commands to either one of the program space or the remote control space; controlling, by the module compute system, the model compute device responsive to an addition of a user-selected command to the remote control space; and generating, by the module compute system, a second program stack responsive to an addition of the user-selected command to the program space.

Example 21 is an apparatus for physical programming for a model compute device, the apparatus comprising: means for determining, by a module compute system, a first program stack for execution based on first rules associated with one or more physical subcomponents assembled in a constructed model in a first control modality, wherein at least one first rule defines a first predetermined behavior of the constructed model; means for accessing, by the module compute system, a value of a predominance setting in response to receiving an input, of a second control modality, that is not consistent with the first program stack; and means for determining whether an action is to be performed by the constructed model responsive to the value of the predominance setting.

Example 22 include the subject matter of example 21, and further comprising: means for contemporaneously displaying, by the module compute system, a plurality of program spaces; means for detecting, by the module compute system, a user input corresponding to an addition of a command to the plurality of program spaces; means for immediately controlling, by the module compute system, a physical movement of the constructed model or an output by the constructed model in response to an addition of the command to the first program space; and means for generating, by the module compute system, a second program stack that is different than the first program stack in response to an addition of the command to the second program space.

Example 23 includes the subject matter of examples 21-22, and further comprising: means for controlling, by the module compute system, the physical movement of the constructed model or the output by the constructed model in response to a user input to execute the second program stack.

Example 24 includes the subject matter of examples 21-23, and the first program space corresponds to a remote controller.

Example 25 includes the subject matter of examples 21-24, and means for displaying, by the module compute system, a plurality of commands associated with the first rules; means for displaying, by the module compute system, a program space and a remote control space; means for displaying, by the module compute system, a user interface to add a user selected one of the commands to either one of the program space or the remote control space; means for controlling, by the module compute system, the model compute device responsive to an addition of a user-selected command to the remote control space; and means for generating, by the module compute system, a second program stack responsive to an addition of the user-selected command to the program space.

What is claimed is:
1. A system, comprising:
one or more processors; and
a model coordination module to be operated by the one or more processors to control a model based on more than one control modality, the model coordination module to:
identify first rules associated with physical subcomponents assembled in the model in a first control modality of the more than one control modality, wherein the first control modality is based on positions of the physical subcomponents relative to each other, and wherein at least one first rule defines a first predetermined behavior of the model;
determine a first program stack for execution by a compute device of the model based on the first rules associated with the physical subcomponents, wherein the compute device of the model comprises a first compute device; and
a predominance module to be operated by the one or more processors to check for inconsistency between the first program stack and a second control modality that is of the more than one control modality and different than the first control modality, wherein the second control modality corresponds to a remote controller or a remote control graphical user interface of a second compute device to communicatively couple to the first compute device; and
the model coordination module further to generate a second program stack that is a modification of the first program stack responsive to an input received over at least one of an internal bus, a network, or a short range wireless connection, the input originating from a program stack editor user interface of the second compute device.

2. The system of claim 1, wherein the model comprises a sensor to detect a physical manipulation, by a user, of the model.

3. The system of claim 2, wherein the sensor includes a microphone.

4. The system of claim 1, wherein the predominance module is to generate a notification to re-assemble the model in response to detection of an inconsistency between the first program stack and a signal representative of a user input into the remote controller or the second compute device.

5. The system of claim 4, wherein the notification includes a user instruction for a particular re-assembly of the physical subcomponents.

6. The system of claim 1, wherein the predominance module is further to generate the second program stack in response to detection of an inconsistency between the first program stack and a signal representative of a user input into the remote controller or the second compute device.

7. The system of claim 1, further comprising:
a programming user interface module to be operated by the one or more processors to:
identify second rules associated with one or more expressions in said second control modality, wherein at least one second rule defines a second predetermined behavior of the model; and
determine a second program stack for execution by the first compute device based on the second rules associated with the one or more expressions.

8. The system of claim 1, further comprising:
a detection module to be operated by the one or more processors to detect a physical manipulation of the model;
wherein the model coordination module is to generate the second program stack responsive to detection of physical manipulation of the model independently of the second control modality.

9. A non-transitory computer-readable medium having instructions stored thereon that, in response to execution by a processing device, cause the processing device to perform operations, to:
determine a first program stack for execution by a compute device of a model controllable by more than one control modality based on first rules associated with physical subcomponents assembled in the model in a first control modality of the more than one control modality, wherein at least one first rule defines a first predetermined behavior of the model, wherein the compute device comprises a first compute device;
access a value of a predominance setting in response to receiving an input, of a second control modality that is of the more than one control modality, different than the first control modality, and not consistent with the first program stack, wherein the second control modality corresponds to a remote controller or a remote control graphical user interface of a second compute device to communicatively couple to the first compute device;
determine whether an action is to be performed by the model based on the value of the predominance setting;
determine a position of one of the physical subcomponents relative to at least one other physical subcomponent of the physical subcomponents; and
cause a user notification to be displayed by the first compute device or the second compute device to communicatively couple to the first device, the user notification to be displayed responsive to the predominance setting and based on the determined position.

10. The non-transitory computer-readable medium of claim 9, wherein the user notification includes a user instruction for re-assembly of the physical subcomponents.

11. The non-transitory computer-readable medium of claim 9, wherein the operations are further to acquire the value of the predominance setting over at least one of a network or a short range wireless connection.

12. The non-transitory computer-readable medium of claim 9, wherein the operations are further to re-associate the first rules and the physical subcomponents or associate a new rule to a physical subcomponent of the physical subcomponents.

13. A method, comprising:
determining, by a compute system, a first program stack for execution by a compute device of a model controllable by more than one control modality based on first rules associated with physical subcomponents assembled in the model in a first control modality of the more than one control modality, wherein at least one first rule defines a first predetermined behavior of the model, wherein the compute device comprises a first compute device;
accessing, by the compute system, a value of a predominance setting in response to receiving an input, of a second control modality, that is not consistent with the first program stack, wherein the second control modality corresponds to a remote controller or a remote control graphical user interface of a second compute device to communicatively couple to the first compute device; and
determining whether an action is to be performed by the model responsive to the value of the predominance setting;
determining a position of one of the physical subcomponents relative to at least one other physical subcomponent of the physical subcomponents; and
causing a user notification to be displayed by the first compute device or the second compute device to communicatively couple to the first device, the user notification to be displayed responsive to the predominance setting and based on the determined position.

14. The method of claim 13, further comprising:
contemporaneously displaying, by the compute system, a plurality of program spaces;
detecting, by the compute system, a user input corresponding to an addition of a command to the plurality of program spaces;

in response to an addition of the command to a first program space, immediately controlling, by the compute system, a physical movement of the model or an output by the model; and in response to an addition of the command to a second program space, generating, by the compute system, a second program stack that is different than the first program stack.

15. The method of claim 14, further comprising:
in response to a user input to execute the second program stack, controlling, by the compute system, the physical movement of the model or the output by the model.

16. The method of claim 15, wherein the first program space corresponds to the second compute device.

17. The method of claim 13, further comprising:
displaying, by the compute system, a plurality of commands associated with the first rules;
displaying, by the compute system, a program space and a remote control space;
displaying, by the compute system, a user interface to add a user-selected one of the commands to either one of the program space or the remote control space;
controlling, by the compute system, the first compute device responsive to an addition of a user-selected command to the remote control space; and
generating, by the compute system, a second program stack responsive to an addition of the user-selected command to the program space.

18. A computer system, comprising:
a display device; and
processor circuitry communicatively coupled with memory circuitry, wherein the processor circuitry is to:
identify first rules associated with physical subcomponents of a physically assembled model in a first control modality of a plurality of control modalities, wherein the first control modality is based on positions of the physical subcomponents relative to other physical subcomponents in a first assembled model, and wherein at least one first rule of the first rules defines a behavior of the assembled model;
determine a first program stack for execution by the physically assembled model based on the first rules associated with the physical subcomponents;
generate and render a graphical user interface (GUI) on the display device, wherein the GUI is a remote control GUI or a program stack editor GUI, and wherein the GUI is associated with a second control modality of the plurality of control modalities that is different than the first control modality;
generate, in response to detection of one or more inputs via the GUI, a second program stack that is a modification of the first program stack and for execution by the assembled model;
detect an inconsistency between the first program stack and the second control modality; and
control performance of a predetermined action based on the detected inconsistency.

19. The computer system of claim 18, wherein the model comprises a sensor to detect a physical manipulation of the model by a user.

20. The computer system of claim 19, wherein the processor circuitry is to:
detect a physical manipulation of the model based on sensor data of the sensor; and
generate the second program stack is response to detection of the physical manipulation of the model independently of the second control modality.

21. The computer system of claim 18, further comprising:
interface circuitry communicatively coupled with the processor circuitry, the interface circuitry is to revieve the one or more inputs over at least one of an internal bus, a network, or a short range wireless connection.

22. The computer system of claim 21, wherein the notification includes a user instruction for a particular re-assembly of the physical subcomponents.

23. The computer system of claim 18, wherein the predetermined action is a notification to re-assemble the physical subcomponents of the assembled model in response, and the processor circuitry is to generate an instance of the GUI to include the notification.

24. The computer system of claim 18, wherein the processor circuitry is to:
identify second rules associated with one or more expressions in the second control modality associated with the GUI, wherein at least one second rule defines a second predetermined behavior of the assembled model; and
determine the second program stack for execution by the assembled model based on the second rules associated with the one or more expressions.

25. The system of claim 18, wherein the processor circuitry is to:
generate and render the remote control GUI on a first portion of the display device; and
generate and render the program stack editor GUI on a second portion of the display device.

* * * * *